(12) United States Patent
Liu et al.

(10) Patent No.: US 7,745,797 B1
(45) Date of Patent: Jun. 29, 2010

(54) DIGITAL X-RAY DETECTOR ASSEMBLY

(75) Inventors: James Zhengshe Liu, Glenview, IL (US); Chen Zhang, Beijing (CN); Habib Vafi, Brookfield, WI (US); Zhimin Sun, Beijing (CN); Kenneth Scott Kump, Waukesha, WI (US); Clifford Bueno, Clifton Park, NY (US); Clarence Lavere Gordon, III, Renton, WA (US)

(73) Assignee: General Electric Co., Schenectady, NY (US)

( * ) Notice: Subject to any disclaimer, the term of this patent is extended or adjusted under 35 U.S.C. 154(b) by 0 days.

(21) Appl. No.: 12/396,730

(22) Filed: Mar. 3, 2009

(51) Int. Cl.
*H01L 27/146* (2006.01)
*G01T 1/20* (2006.01)

(52) U.S. Cl. .................................. 250/370.09

(58) Field of Classification Search ............ 250/370.01, 250/370.08, 370.09, 483.1, 484.2, 484.4; 378/98.8
See application file for complete search history.

(56) References Cited

U.S. PATENT DOCUMENTS

| | | | |
|---|---|---|---|
| 7,108,252 B2 | 9/2006 | Jayakumaran | |
| 2004/0217294 A1* | 11/2004 | Zur | 250/370.09 |
| 2008/0217550 A1* | 9/2008 | Shoji et al. | 250/370.11 |

* cited by examiner

*Primary Examiner*—David P Porta
*Assistant Examiner*—Mark R Gaworecki

(57) ABSTRACT

A digital radiography imaging system having a digital x-ray detector that is easy to manufacture and produces high quality images with no artifacts. The digital x-ray detector including a front cover, a scintillator screen member, a light imager panel member having a surface in direct contact with an adjoining surface of the scintillator screen member, a compressible member positioned between the front cover and the scintillator screen member to apply pressure to the scintillator screen member and the adjoining surface between the scintillator screen member and the light imager panel member, electronic circuitry mounted on at least one printed circuit board and coupled to the light imager panel, a back cover, and a plurality of fasteners for fastening the front cover to the back cover.

23 Claims, 7 Drawing Sheets

DIGITAL X-RAY DETECTOR ASSEMBLY

BACKGROUND OF THE INVENTION

This disclosure relates generally to digital radiography imaging systems, and more particularly to an improved digital x-ray detector for use in such systems.

A number of radiography imaging systems of various designs are known and are presently in use. Such systems generally are based upon generation of x-rays that are directed toward a subject of interest. The x-rays traverse the subject and impact a film or a digital detector. Increasingly, such radiography systems use digital circuitry for detecting the x-rays, which are attenuated, scattered or absorbed by the intervening structures of the subject. In medical imaging contexts, for example, such systems may be used to visualize the internal structures, tissues and organs of a subject for the purpose of screening or diagnosing ailments. In other contexts, parts, structures, baggage, parcels, and other subjects may be imaged to assess their contents, structural integrity or other purposes.

Digital radiography imaging systems generally include digital flat panel x-ray detectors that generally provide higher image quality and improved processing time, image storage and image transfer over previously known x-ray film techniques. However, there may be structural limitations with certain digital x-ray detectors that may create artifacts in the x-ray images. These image artifacts can degrade the overall image quality of digital radiography imaging systems.

A typical structure for a digital flat panel x-ray detector may include a scintillator screen member; a light imager panel member; and electronic circuitry enclosed within an enclosure. The scintillator screen member must be in close uniform contact over the entire surface area of the light imager panel member in order to maintain good spatial resolution and prevent image artifacts. Any air gap between the scintillator screen member and the light imager panel member creates very poor spatial resolution greatly degrading image quality. In addition, static electricity is produced when the detector is brought into close proximity with a subject undergoing an imaging procedure prior to taking an x-ray exposure. This static electricity generates artifacts in the x-ray images.

Prior art solutions to removing any air gaps between a scintillator screen member and a light imager panel member in a digital flat panel x-ray detector include removing the air between the scintillator screen member and the light imager panel member, and using a light transparent adhesive to affix or glue the scintillator screen member to the light imager panel member. Disadvantages of these solutions are that the adhesive degrades the spatial resolution of the detector, air leaks may occur over time, and it creates a difficult manufacturing process.

Therefore, there is a need for a digital radiography imaging system having a digital x-ray detector that is easy to manufacture and produces high quality images with no artifacts.

BRIEF DESCRIPTION OF THE INVENTION

In accordance with an aspect of the present disclosure, a digital x-ray detector comprising a front cover, a scintillator screen member, a light imager panel member having a surface in direct contact with an adjoining surface of the scintillator screen member, a compressible member positioned between the front cover and the scintillator screen member to apply pressure to the scintillator screen member and the adjoining surface between the scintillator screen member and the light imager panel member, electronic circuitry mounted on at least one printed circuit board and coupled to the light imager panel, a back cover, and a plurality of fasteners for fastening the front cover to the back cover.

In accordance with another aspect of the present disclosure, a digital x-ray detector comprising a front cover, a scintillator screen member, a light imager panel member having a surface in direct contact with an adjoining surface of the scintillator screen member, a compressible member positioned between the front cover and the scintillator screen member to apply pressure to the scintillator screen member and the adjoining surface between the scintillator screen member and the light imager panel member, a conductive member positioned between the compressible member and the scintillator screen member, electronic circuitry mounted on at least one printed circuit board and coupled to the light imager panel, a back cover, and a plurality of fasteners for fastening the front cover to the back cover.

In accordance with a further aspect of the present disclosure, a digital x-ray detector comprising a front cover, a scintillator screen member, a light imager panel member having a surface in direct contact with an adjoining surface of the scintillator screen member, a conductive compressible member positioned between the front cover and the scintillator screen member to apply pressure to the scintillator screen member and the adjoining surface between the scintillator screen member and the light imager panel member, electronic circuitry mounted on at least one printed circuit board and coupled to the light imager panel, a back cover; and a plurality of fasteners for fastening the front cover to the back cover.

Various other features, aspects, embodiments and advantages will be made apparent to those skilled in the art from the accompanying drawings and detailed description thereof.

DETAILED DESCRIPTION OF THE INVENTION

Figure 1:
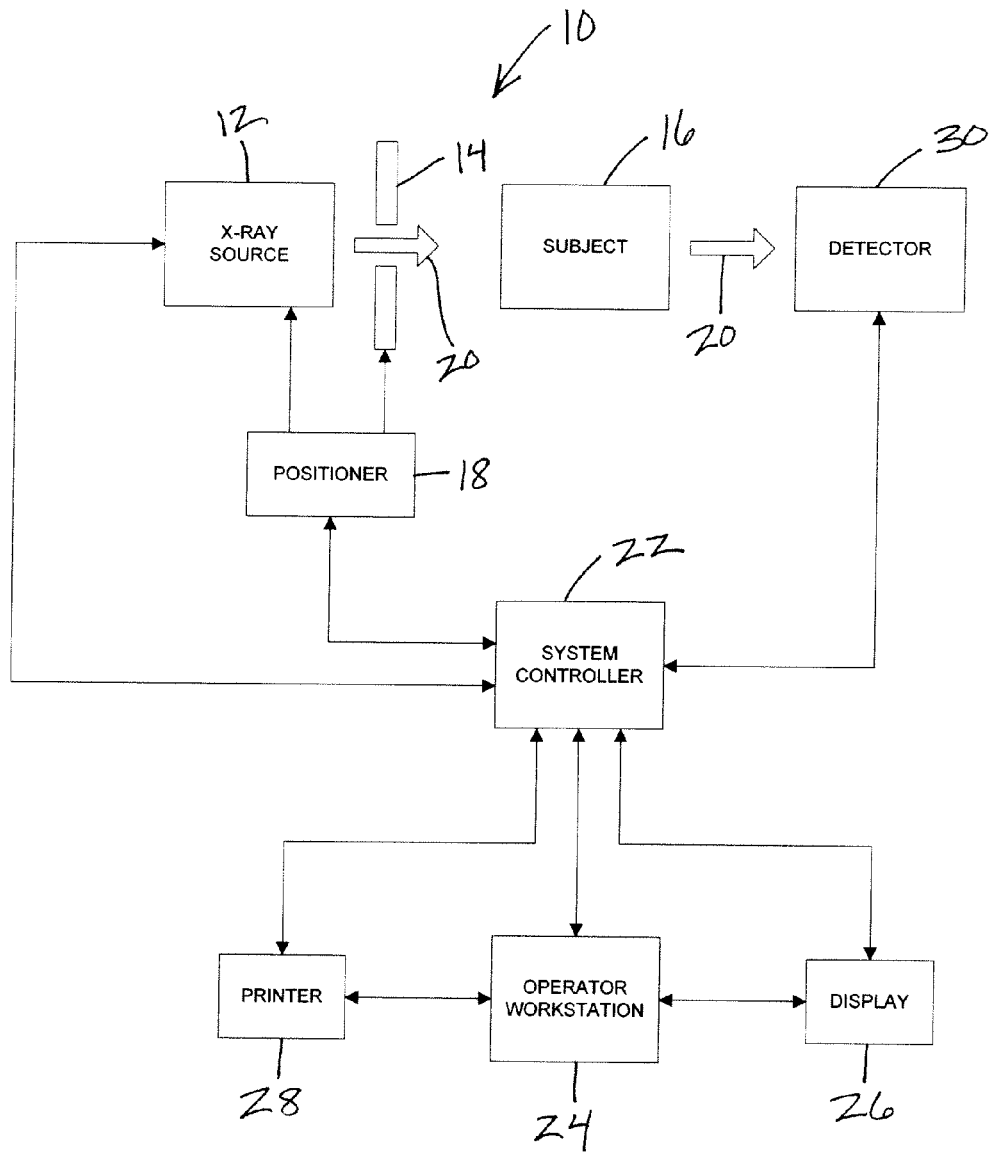
FIG. 1 is a block diagram of an exemplary embodiment of a digital radiography imaging system.

Referring to the drawings, FIG. 1 illustrates a block diagram of an exemplary embodiment of a digital radiography imaging system 10. The digital radiography imaging system 10 includes an x-ray source 12, a collimator 14 adjacent to the x-ray source 12, a subject 16 to be imaged, a detector 30, and a positioner 18. The positioner 18 is a mechanical controller coupled to x-ray source 12 and collimator 14 for controlling the positioning of x-ray source 12 and collimator 14.

The digital radiography imaging system 10 is designed to create images of the subject 16 by means of an x-ray beam 20 emitted by x-ray source 12, and passing through collimator 14, which forms and confines the x-ray beam 20 to a desired region, wherein the subject 16, such as a human patient, an animal or an object, is positioned. A portion of the x-ray beam 20 passes through or around the subject 16, and being altered by attenuation and/or absorption by tissues within the subject 16, continues on toward and impacts the detector 30. In an exemplary embodiment, the detector 30 may be a fixed detector or a portable detector. In an exemplary embodiment, the detector 30 may be a digital flat panel x-ray detector. The detector 30 converts x-ray photons received on its surface to lower energy light photons, and subsequently to electric signals, which are acquired and processed to reconstruct an image of internal anatomy within the subject 16.

The digital radiography imaging system 10 further includes a system controller 22 coupled to x-ray source 12, positioner 18, and detector 30 for controlling operation of the x-ray source 12, positioner 18, and detector 30. The system controller 22 may supply both power and control signals for imaging examination sequences. In general, system controller 22 commands operation of the radiography system to execute examination protocols and to process acquired image data. The system controller 22 may also include signal processing circuitry, based on a general purpose or application-specific computer, associated memory circuitry for storing programs and routines executed by the computer, as well as configuration parameters and image data, interface circuits, and so forth.

The system controller 22 may further include at least one processor designed to coordinate operation of the x-ray source 12, positioner 18, and detector 30, and to process acquired image data. The at least one processor may carry out various functionality in accordance with routines stored in the associated memory circuitry. The associated memory circuitry may also serve to store configuration parameters, operational logs, raw and/or processed image data, and so forth. In an exemplary embodiment, the system controller 22 includes at least one image processor to process acquired image data.

The system controller 22 may further include interface circuitry that permits an operator or user to define imaging sequences, determine the operational status and health of system components, and so-forth. The interface circuitry may allow external devices to receive images and image data, and command operation of the radiography system, configure parameters of the system, and so forth.

The system controller 22 may be coupled to a range of external devices via a communications interface. Such devices may include, for example, an operator workstation 24 for interacting with the radiography system, processing or reprocessing images, viewing images, and so forth. In the case of tomosynthesis systems, for example, the operator workstation 24 may serve to create or reconstruct image slices of interest at various levels in the subject based upon the acquired image data. Other external devices may include a display 26 or a printer 28. In general, these external devices 24, 26, 28 may be local to the image acquisition components, or may be remote from these components, such as elsewhere within a medical facility, institution or hospital, or in an entirely different location, linked to the image acquisition system via one or more configurable networks, such as the Internet, intranet, virtual private networks, and so forth. Such remote systems may be linked to the system controller 22 by any one or more network links. It should be further noted that the operator workstation 24 may be coupled to the display 26 and printer 28, and may be coupled to a picture archiving and communications system (PACS). Such a PACS might be coupled to remote clients, such as a radiology department information system or hospital information system, or to an internal or external network, so that others at different locations may gain access to image data.

Figure 2:
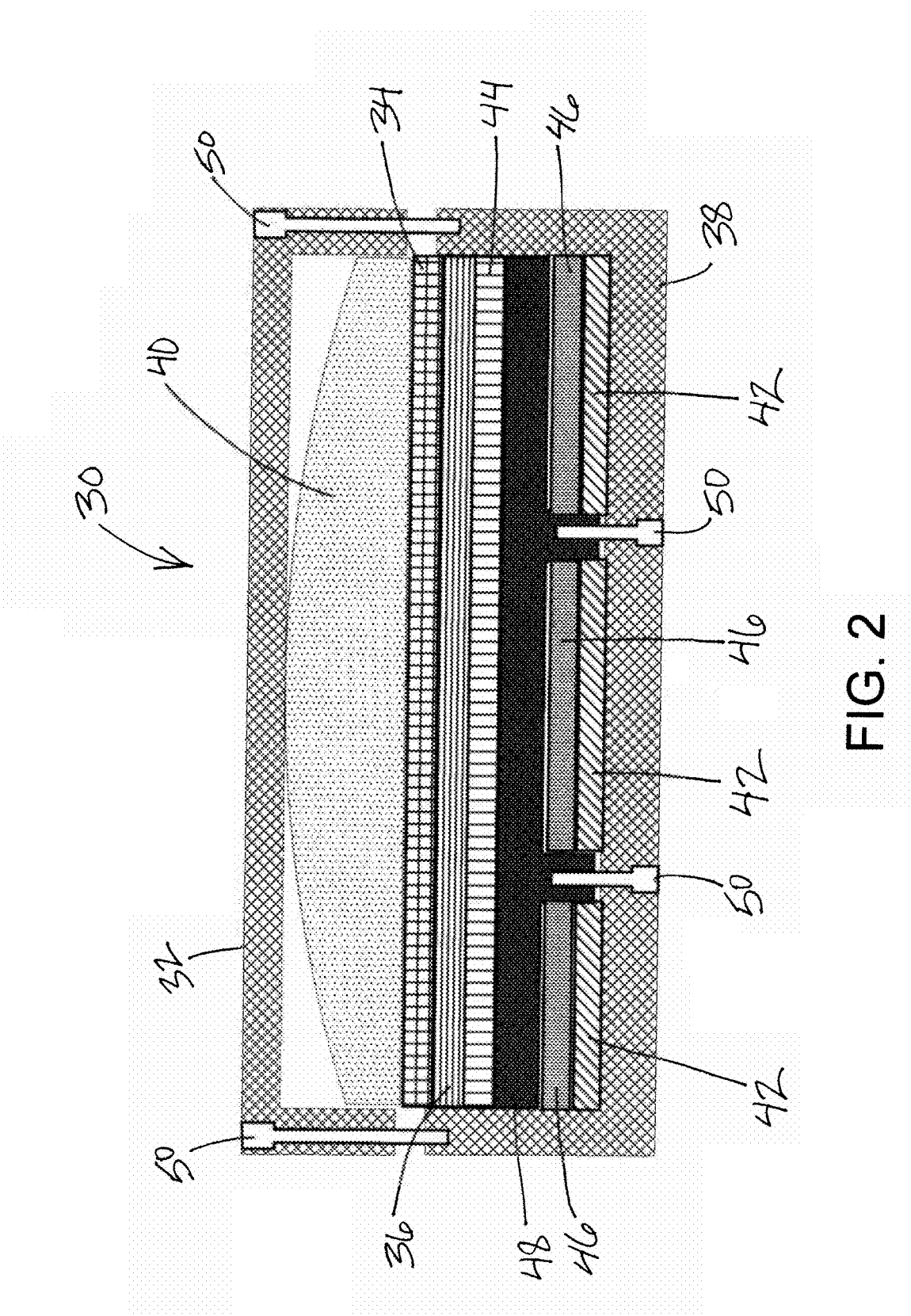
FIG. 2 is an exploded cross-sectional block diagram of an exemplary embodiment of a digital x-ray detector.

FIG. 2 illustrates an exploded cross-sectional block diagram of an exemplary embodiment of a digital x-ray detector 30. The digital x-ray detector 30 includes a front cover 32, a scintillator screen member 34, a light imager panel member 36, electronic circuitry mounted on at least one printed circuit board 42, and a back cover 38. The scintillator screen member 34 absorbs x-ray photons from the x-ray source and converts them into light photons. The light photons are directed toward the light imager panel member 36. The light imager panel member 36 absorbs the light photons and converts them into electronic signals. The electronic signals are read out by the electronic circuitry 42 and turned into digital data that is sent to an image processor for processing. A plurality of fasteners 50 are used to fasten the front cover 32 to the back cover 38, and the panel support member 48 to the back cover 38.

The scintillator screen member 34 is placed in direct contact with the light imager panel member 36. One surface of the scintillator screen member 34 is positioned adjacent to one surface of the light imager panel member 36, such that the light imager panel member 36 has a surface in direct contact with an adjoining surface of the scintillator screen member 34. In an exemplary embodiment, the scintillator screen member 34 may be a high-resolution x-ray intensifying screen made of a luminescent material.

In order to keep the one surface of the scintillator screen member 34 in direct contact with the one surface of the light imager panel member 36, there must be pressure between the scintillator screen member 34 and the light imager panel member 36. To provide this pressure, a compressible member 40 is inserted between the front cover 32 and the scintillator screen member 34. The compressible member 40 applies pressure to the scintillator screen member 34 and the adjoining surface between the scintillator screen member 34 and the light imager panel member 36. In an exemplary embodiment, the compressible member 40 may be a compressible foam material.

The light imager panel member 36 is positioned on a panel support member 48 with a first isolation member 44 placed in between. In an exemplary embodiment, the panel support member 48 may be a rigid member for supporting the light imager panel member 36 and the scintillator screen member 34 within the detector enclosure. In an exemplary embodiment, the first isolation member 44 provides cushioning and insulation between the light imager panel member 36 and the panel support member 48. In an exemplary embodiment, the first isolation member 44 may be a foam material.

The electronic circuitry on the at least one printed circuit board 42 is coupled to the light imager panel member 36 and is isolated from the panel support member 48 by a second isolation member 46. In an exemplary embodiment, the second isolation member 46 provides cushioning and insulation between the panel support member 48 and the electronic circuitry on the at least one printed circuit board 42. In an exemplary embodiment, the second isolation member 46 may be a foam material.

Figure 3:
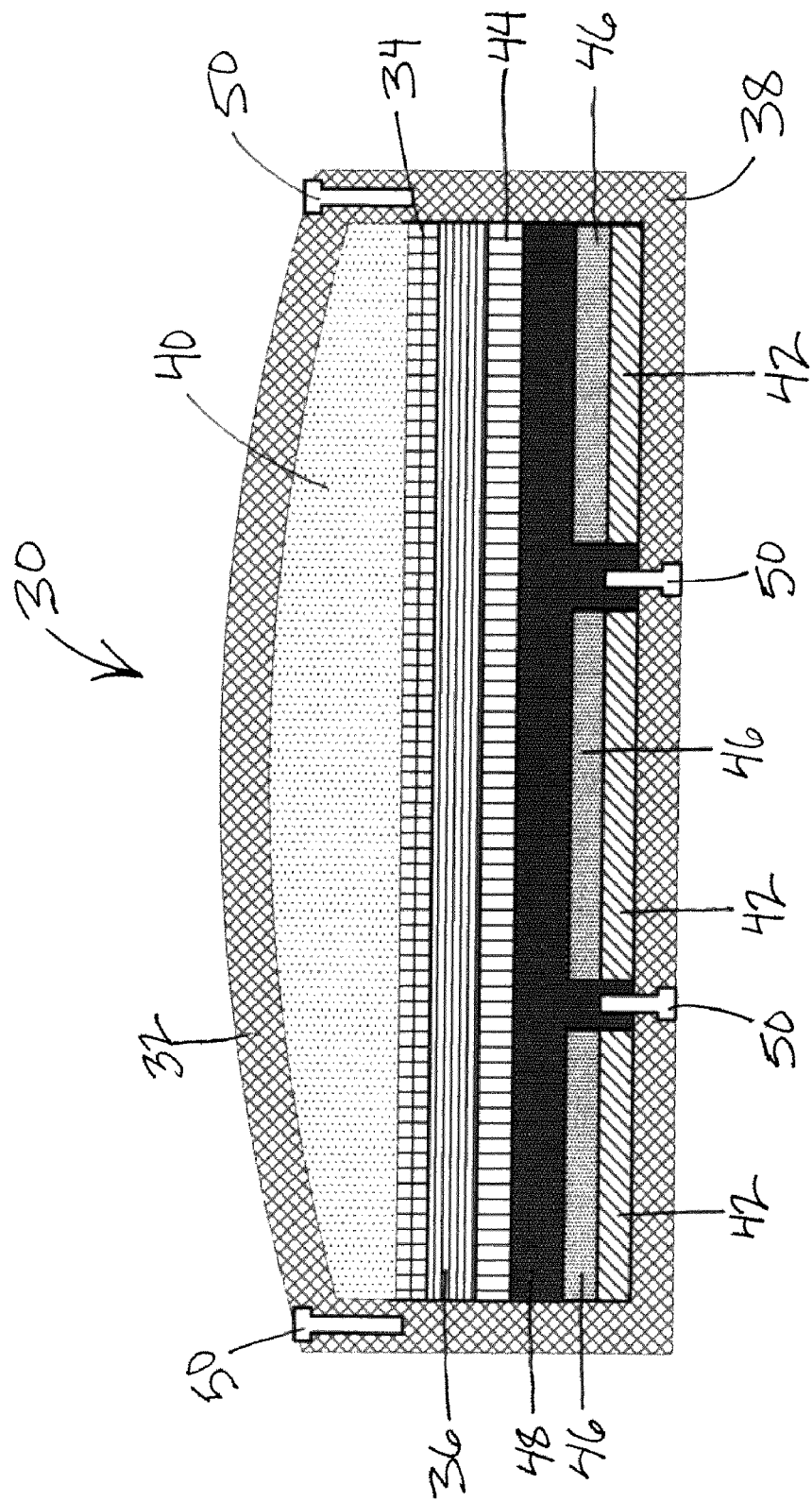
FIG. 3 is a cross-sectional block diagram of an exemplary embodiment of a digital x-ray detector.

FIG. 3 illustrates a cross-sectional block diagram of an exemplary embodiment of the digital x-ray detector 30 with the front cover 32 fastened to the back cover 38, and the panel support member 48 fasted to the back cover 38 with a plurality of fasteners 50. The digital x-ray detector 30 includes the front cover 32, the compressible member 40, the scintillator screen member 34, the light imager panel member 36, the first isolation member 44, the panel support member 48, the second isolation member 46, electronic circuitry mounted on the at least one printed circuit board 42, and the back cover 38.

Placing the compressible member 40 between the front cover 32 and the scintillator screen member 34 maintains pressure on the scintillator screen member 34. By fastening the front cover 32 to the back cover 38, the front cover 32 applies pressure to the compressible member 40, which applies pressure to the scintillator screen member 34, such that the scintillator screen member 34 is in direct contact with the light imager panel member 36 and is pressed uniformly across the entire area of the light imager panel member 36 once the plurality of fasteners 50 are tightened. Since only the edges of the front 32 and back 38 covers of the detector are connected together, the front cover 32 may bow out or bend slightly outward under the pressure, as shown in FIG. 3.

Figure 4:
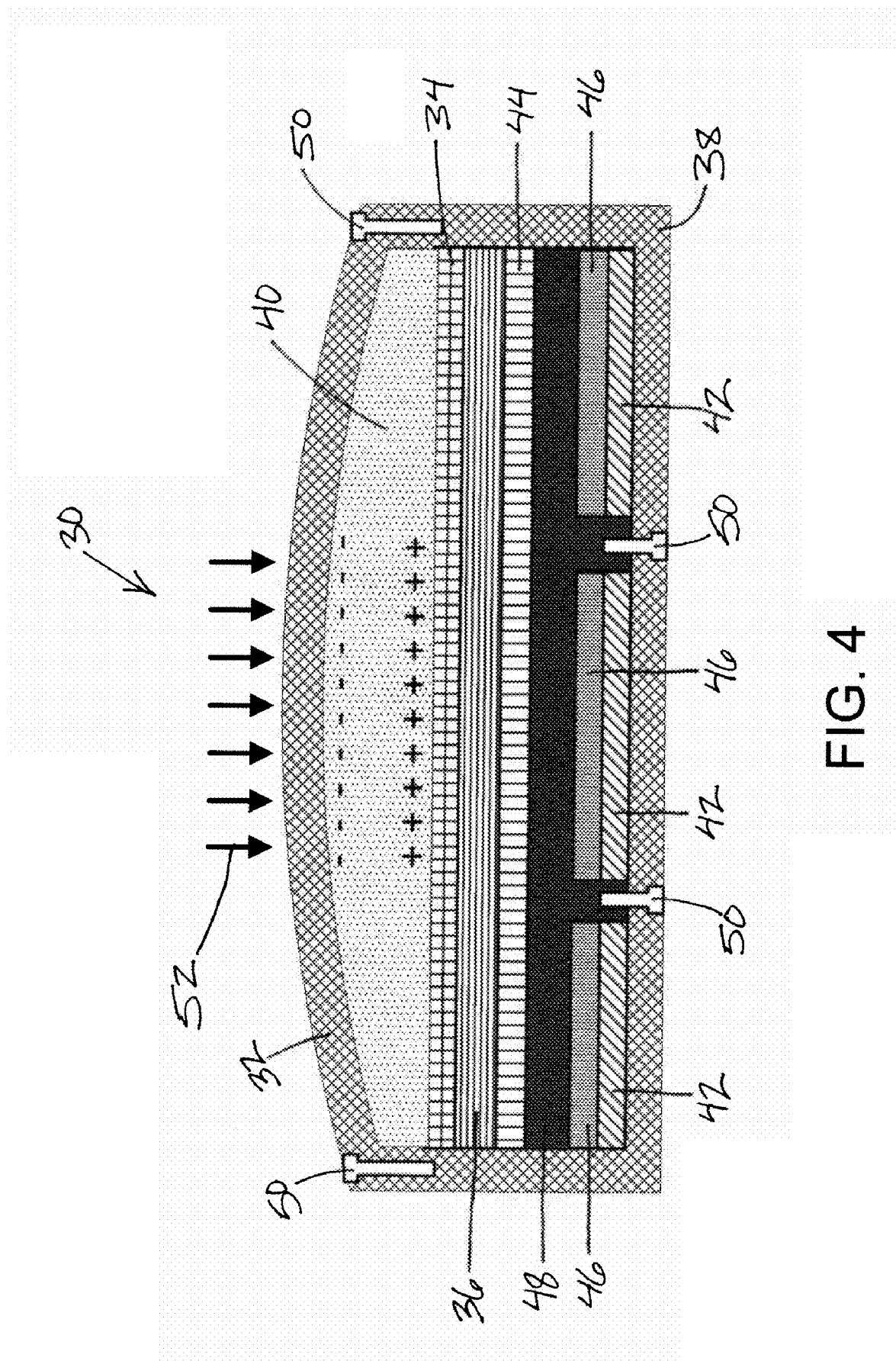
FIG. 4 is a cross-sectional block diagram of an exemplary embodiment of a digital x-ray detector.

FIG. 4 illustrates a cross-sectional block diagram of an exemplary embodiment of the digital x-ray detector 30 showing the presence of static electricity on the detector. Static electricity, identified by the + and − electro-static charges on the compressible member 40, may be produced when the detector 30 is brought into close proximity with a subject (not shown) undergoing an imaging procedure prior to taking an x-ray exposure. A subject rubbing against or coming into contact with the detector's front cover 32, as indicated by arrows 52, may cause static electricity, + and − charges, to be produced as shown in FIG. 4. This static electricity generates artifacts in the x-ray images.

When a subject comes into contact with the detector 30, identified by arrows 52, the subject may apply pressure to the front cover 32, reducing the outward bending of the front cover 32 and further compressing the compressible member 40. This may provide additional pressure and better contact between the scintillator screen member 34 and the light imager panel member 36.

Figure 5:
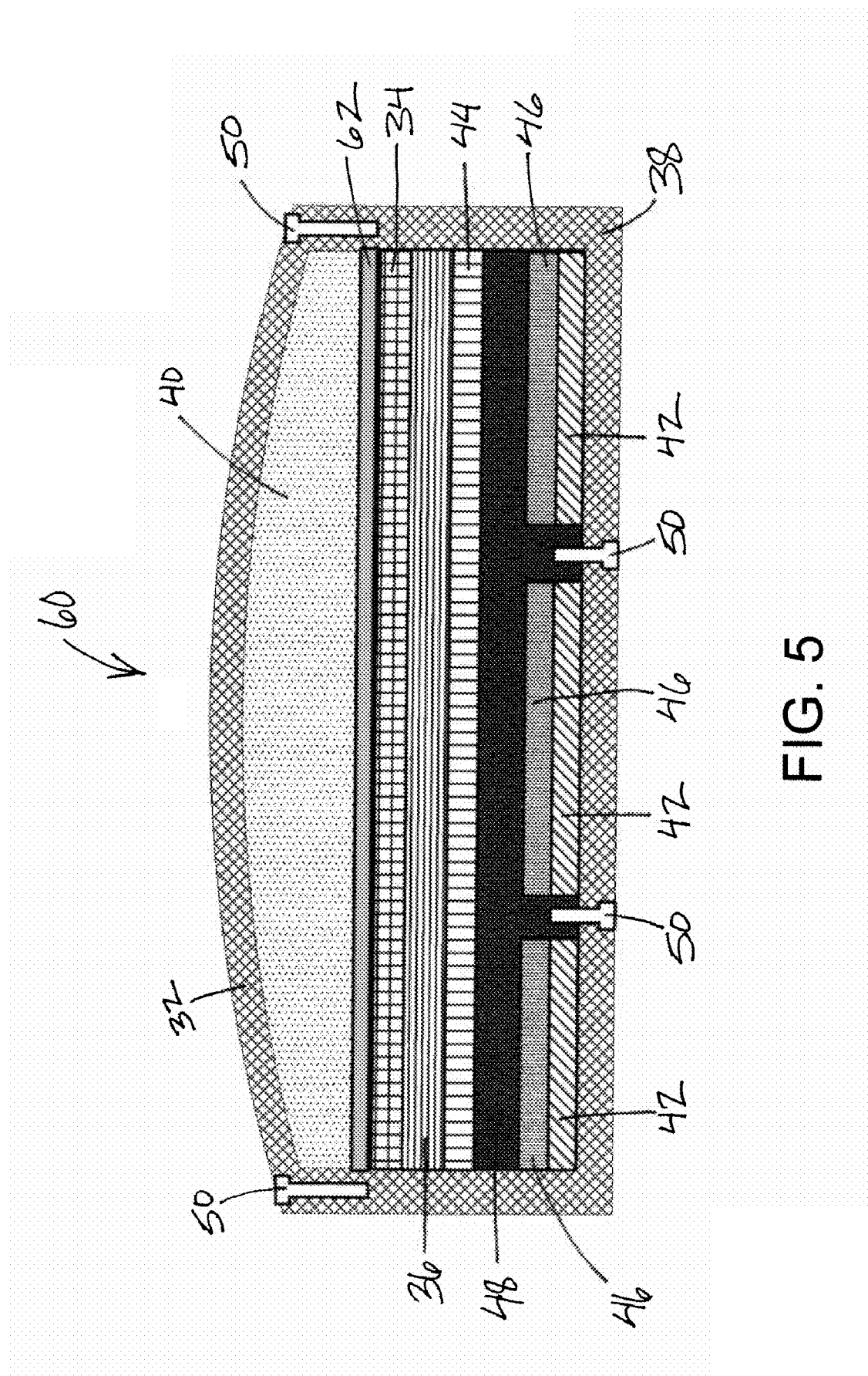
FIG. 5 is a cross-sectional block diagram of an exemplary embodiment of a digital x-ray detector.

FIG. 5 illustrates a cross-sectional block diagram of an exemplary embodiment of a digital x-ray detector 60. The digital x-ray detector 60 includes a front cover 32, a compressible member 40, a scintillator screen member 34, a light imager panel member 36, a first isolation member 44, a panel support member 48, a second isolation member 46, electronic circuitry mounted on the at least one printed circuit board 42, and a back cover 38. The scintillator screen member 34 is in direct contact with the light imager panel member 36. The light imager panel member 36 is positioned on a panel support member 48 with a first isolation member 44 placed in between. The electronic circuitry on the at least one printed circuit board 42 is isolated from the panel support member 48 by a second isolation member 46.

In order to reduce the effects of static electricity, a conductive member 62 is positioned between the compressible member 40 and the scintillator screen member 34. In an exemplary embodiment, the conductive member 62 may be an electrically conductive material that is positioned between a surface of the compressible member 40 and an adjoining surface of the scintillator screen member 34. In an exemplary embodiment, the conductive member 62 may be a coating, film, foil, or laminate of electrically conductive material that is applied to a surface of the compressible member 40 or a surface of the scintillator screen member 34.

Figure 6:
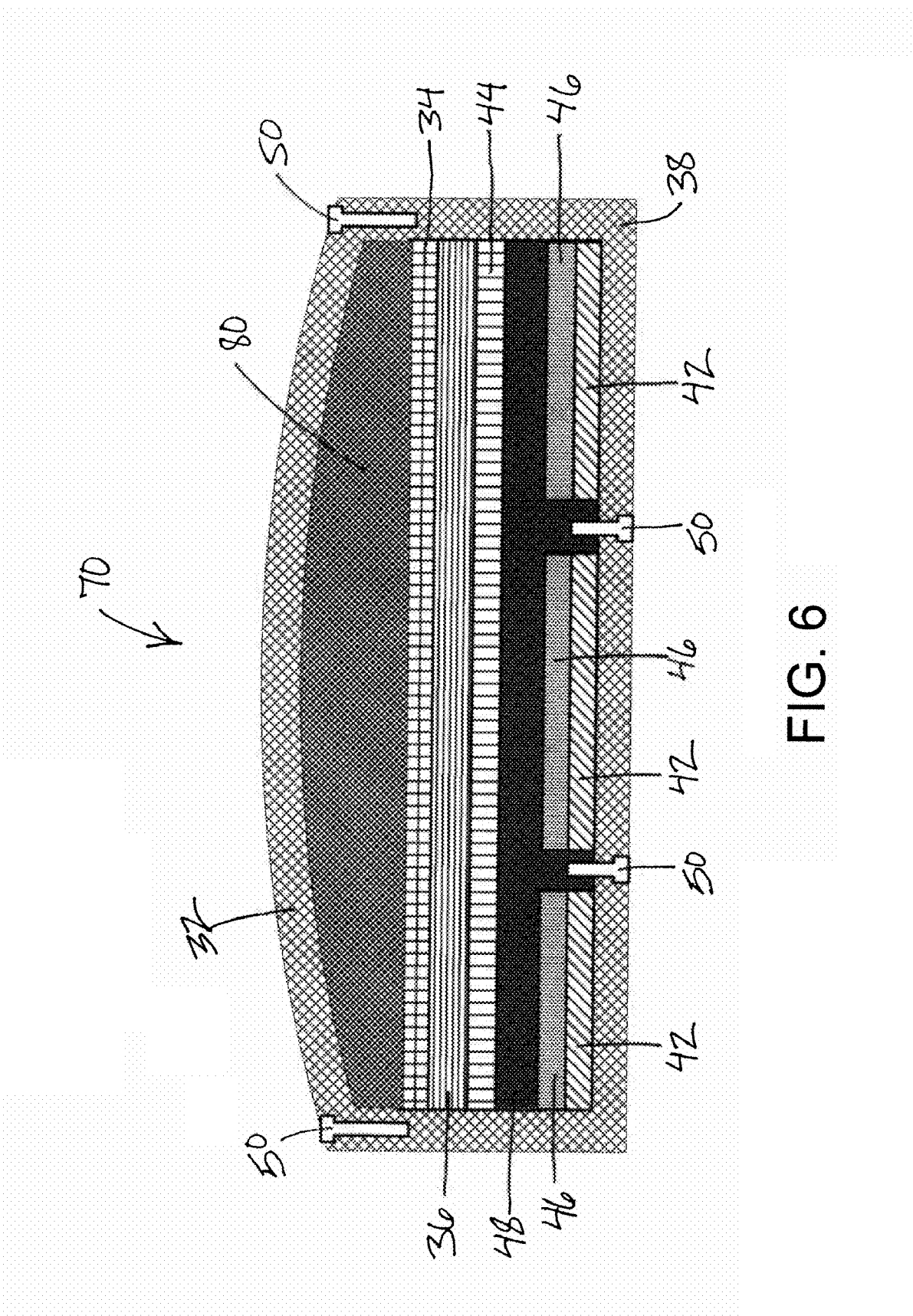
FIG. 6 is a cross-sectional block diagram of an exemplary embodiment of a digital x-ray detector.
Figure 7A:
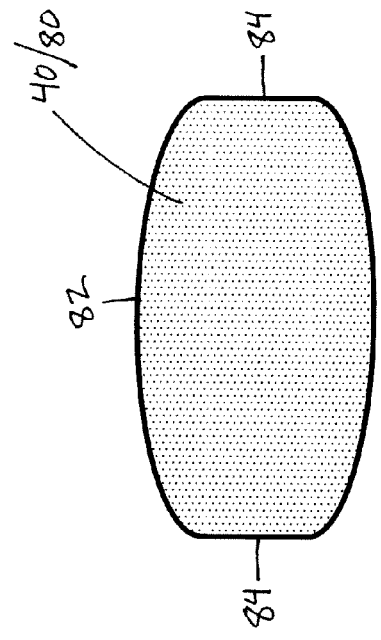
FIGS. 7A-7D are schematic diagrams of exemplary embodiments of shapes of compressible members or conductive compressible members that may be used in a digital x-ray detector.
Figure 7C:
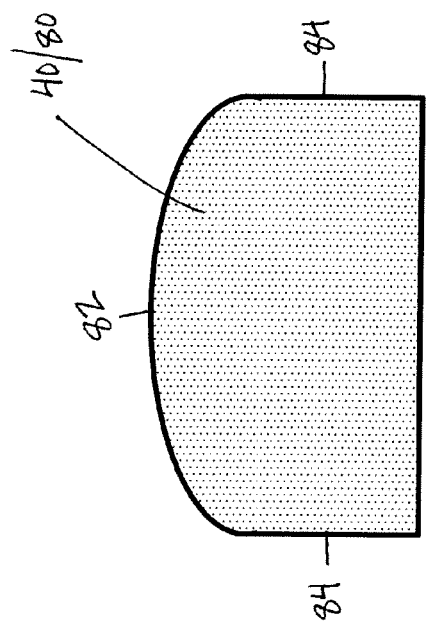
Figure 7B:
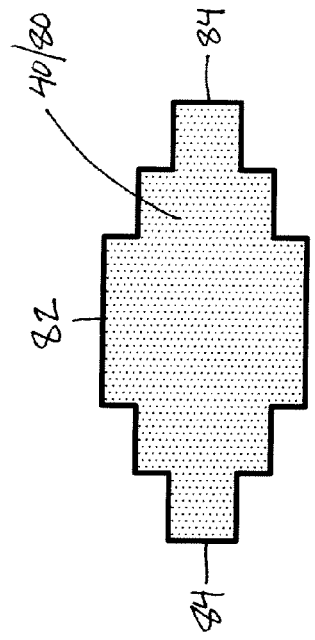
Figure 7D:
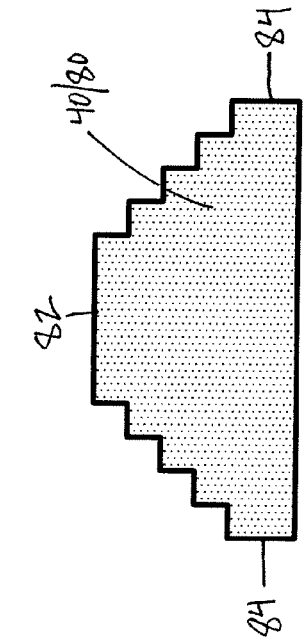

FIG. 6 illustrates a cross-sectional block diagram of an exemplary embodiment of a digital x-ray detector 70. The digital x-ray detector 70 includes a front cover 32, a conductive compressible member 80, a scintillator screen member 34, a light imager panel member 36, a first isolation member 44, a panel support member 48, a second isolation member 46, electronic circuitry mounted on the at least one printed circuit board 42, and a back cover 38. The scintillator screen member 34 is in direct contact with the light imager panel member 36. The scintillator screen member 34 is in direct contact with the light imager panel member 36. One surface of the scintillator screen member 34 is positioned adjacent to one surface of the light imager panel member 36. In order to keep the one surface of the scintillator screen member 34 in direct contact with the one surface of the light imager panel member 36 and to reduce the effects of static electricity, the conductive compressible member 80 is positioned between the front cover 32 and the scintillator screen member 34.

The light imager panel member 36 is positioned on the panel support member 48 with the first isolation member 44 placed in between. The electronic circuitry on the at least one printed circuit board 42 is isolated from the panel support member 48 by the second isolation member 46.

In an exemplary embodiment, the conductive compressible member 80 may be a conductive compressible foam material. In an exemplary embodiment, the conductive compressible member 80 may be an anti-static foam material. The conductive compressible member 80 may include anti-static agents that are designed to eliminate static potential from the member itself, and dissipate electro-static charges from neighboring materials or a subject contacting the detector during an imaging exam. In an exemplary embodiment, the conductive compressible member 80 may be a conductive foam material.

FIGS. 7A-7D illustrate schematic diagrams of exemplary embodiments of shapes of compressible members 40 and conductive compressible members 80 that may be used in a digital x-ray detector 30, 60 or 70. The compressible member 40 and the conductive compressible member 80 includes a middle portion 82 and two end portions 84 on opposite sides of the middle portion 82. In order to maintain uniform pressure on the scintillator screen member that is in contact with the light imager panel member, it may be required that the compressible member 40 and the conductive compressible member 80 be thicker at the middle portion 82 related to the two end portions 84. In other words, the compressible member 40 and the conductive compressible member 80 may be thickest at the middle portion 82 with gradually reducing thickness towards the two end portions 84. The optimal shape of the compressible member 40 and conductive compressible member 80 may be obtained from the bending curvature of the detector's front cover 32. The exemplary shapes of the compressible member 40 and the conductive compressible member 80 may also increase manufacturability of the detector.

The present disclosure provides a digital x-ray detector apparatus with means for maintaining no air gap between a scintillator screen member and a light imager panel improving image quality by eliminating image artifacts and reducing the effects of static electricity. The present disclosure also provides a high quality, low-cost digital x-ray detector apparatus that is relatively easy to manufacture.

Several embodiments are described above with reference to drawings. These drawings illustrate certain details of exemplary embodiments that implement the apparatus, systems, and methods of this disclosure. However, the drawings should not be construed as imposing any limitations associated with features shown in the drawings.

While the disclosure has been described with reference to various embodiments, those skilled in the art will appreciate that certain substitutions, alterations and omissions may be made to the embodiments without departing from the spirit of the disclosure. Accordingly, the foregoing description is meant to be exemplary only, and should not limit the scope of the disclosure as set forth in the following claims.

What is claimed is:

1. A digital x-ray detector comprising:
   a front cover;
   a scintillator screen member;
   a light imager panel member having a surface in direct contact with an adjoining surface of the scintillator screen member;
   a compressible member positioned between the front cover and the scintillator screen member to apply pressure to the scintillator screen member and the adjoining surface between the scintillator screen member and the light imager panel member;
   electronic circuitry mounted on at least one printed circuit board and coupled to the light imager panel;
   a back cover; and
   a plurality of fasteners for fastening the front cover to the back cover;
   wherein the light imager panel member is positioned on a panel support member with a first isolation member placed in between.

2. The digital x-ray detector of claim 1, wherein the compressible member applies pressure to the scintillator screen member and the adjoining surface between the scintillator screen member and the light imager panel member when the front cover is fastened to the back cover.

3. The digital x-ray detector of claim 1, wherein the panel support member is a rigid member for supporting the light imager panel member and the scintillator screen member.

4. The digital x-ray detector of claim 1, wherein the first isolation member is a foam material.

5. The digital x-ray detector of claim 1, wherein the electronic circuitry on the at least one printed circuit board is isolated from the panel support member by a second isolation member.

6. The digital x-ray detector of claim 5, wherein the second isolation member is a foam material.

7. The digital x-ray detector of claim 1, wherein the scintillator screen member is a high-resolution x-ray intensifying screen made of a luminescent material.

8. The digital x-ray detector of claim 1, wherein the compressible member is a compressible foam material.

9. The digital x-ray detector of claim 1, wherein the compressible member includes a middle portion and two end portions on opposite sides of the middle portion.

10. The digital x-ray detector of claim 9, wherein the compressible member is thickest at the middle portion with gradually reducing thickness towards the two end portions.

11. A digital x-ray detector comprising:
    a front cover;
    a scintillator screen member;
    a light imager panel member having a surface in direct contact with an adjoining surface of the scintillator screen member;
    a compressible member positioned between the front cover and the scintillator screen member to apply pressure to the scintillator screen member and the adjoining surface between the scintillator screen member and the light imager panel member;
    a conductive member positioned between the compressible member and the scintillator screen member;
    electronic circuitry mounted on at least one printed circuit board and coupled to the light imager panel;
    a back cover; and
    a plurality of fasteners for fastening the front cover to the back cover.

12. The digital x-ray detector of claim 11, wherein the compressible member applies pressure to the scintillator screen member and the adjoining surface between the scintillator screen member and the light imager panel member when the front cover is fastened to the back cover.

13. The digital x-ray detector of claim 11, wherein the compressible member is a compressible foam material.

14. The digital x-ray detector of claim 11, wherein the compressible member includes a middle portion and two end portions on opposite sides of the middle portion.

15. The digital x-ray detector of claim 14, wherein the compressible member is thickest at the middle portion with gradually reducing thickness towards the two end portions.

16. The digital x-ray detector of claim 11, wherein the conductive member is electrically conductive material positioned between a surface of the compressible member and an adjoining surface of the scintillator screen member.

17. The digital x-ray detector of claim 11, wherein the conductive member is a coating, film, foil, or laminate of electrically conductive material that is applied to a surface of the compressible member or a surface of the scintillator screen member.

18. A digital x-ray detector comprising:
    a front cover;
    a scintillator screen member;
    a light imager panel member having a surface in direct contact with an adjoining surface of the scintillator screen member;
    a conductive compressible member positioned between the front cover and the scintillator screen member to apply pressure to the scintillator screen member and the adjoining surface between the scintillator screen member and the light imager panel member;
    electronic circuitry mounted on at least one printed circuit board and coupled to the light imager panel;
    a back cover, and
    a plurality of fasteners for fastening the front cover to the back cover.

19. The digital x-ray detector of claim 18, wherein the compressible member applies pressure to the scintillator screen member and the adjoining surface between the scintillator screen member and the light imager panel member when the front cover is fastened to the back cover.

20. The digital x-ray detector of claim 18, wherein the conductive compressible member is a conductive compressible foam material.

21. The digital x-ray detector of claim 18, wherein the conductive compressible member is an anti-static foam material.

22. The digital x-ray detector of claim 18, wherein the conductive compressible member includes a middle portion and two end portions on opposite sides of the middle portion.

23. The digital x-ray detector of claim 22, wherein the conductive compressible member is thickest at the middle portion with gradually reducing thickness towards the two end portions.

* * * * *